United States Patent [19]

Meidan et al.

[11] Patent Number: 5,193,102
[45] Date of Patent: Mar. 9, 1993

[54] METHOD AND APPARATUS FOR IMPROVING DETECTION OF DATA BITS IN A SLOW FREQUENCY HOPPING COMMUNICATION SYSTEM

[75] Inventors: Reuven Meidan, Ramat Hasharon; Noam Livneh, D.N. Misgav; Giora Silbershatz, Haifa; Mordechai Ritz, Givat-Elah, all of Israel

[73] Assignee: Motorola, Inc., Schaumburg, Ill.

[21] Appl. No.: 794,104

[22] Filed: Nov. 18, 1991

[30] Foreign Application Priority Data

Nov. 10, 1991 [IL] Israel ............................ 100029

[51] Int. Cl.$^5$ .......................................... H04K 1/00
[52] U.S. Cl. .......................................... 375/1; 380/34
[58] Field of Search ............... 380/34; 375/1, 62, 88, 375/89, 96

[56] References Cited

U.S. PATENT DOCUMENTS

| | | |
|---|---|---|
| 4,271,525 | 6/1981 | Watanabe . |
| 4,479,226 | 10/1984 | Prabhu et al. ........................ 375/1 |
| 4,518,922 | 5/1985 | Luecke ............................. 375/1 X |
| 4,885,757 | 12/1989 | Provence ......................... 375/96 X |
| 4,935,940 | 6/1990 | Reindl ................................ 375/1 |
| 5,031,193 | 7/1991 | Atkinson et al. . |
| 5,103,459 | 4/1992 | Gilhousen et al. .................... 375/1 |

OTHER PUBLICATIONS

"Adaptive Maximum Likelihood Receiver for Carrier-Modulated Data Transmission Systems", Gottfried Ungerboeck, *IEEE Transactions on Communications*, vol. COM-22, No. 5 (May 1974), pp. 624-636.

"Nonlinear Estimation of PSK-Modulated Carrier Phase with Application to Burst Digital Transmission", Andrew J. Viterbi and Audrey M. Viterbi, *IEEE Transactions on Information Theory*, vol. IT-29, No. 4, (Jul. 1983), pp. 543-551.

Sklar, Bernard, *Digital Communications: Fundamentals and Applications*, Prentice Hall, Englewood Cliffs, N.J., 1988, Chapters 5 and 6, pp. 245-380.

*Primary Examiner*—Tod Swann
*Attorney, Agent, or Firm*—Shawn B. Dempster

[57] ABSTRACT

A method and apparatus is provided for improving detection of data bits in data samples (120) of a hop of a slow frequency hopping spread spectrum signal (112). In the detecting process, the carrier to interference (C/I) power ratio of the hop is estimated (124) by using the data samples (120) of the hop. Subsequently, a data bit (130) is detected by using the estimated C/I power ratio (126). The detection process (128) may include utilizing maximum likelihood decoding techniques to derive a data bit (130) from decision metrics and the estimated C/I power ratio (126). The decision metrics correspond to a measurement of the distance of data samples (120) from constellation points within a constellation space representing data samples (120) previously used to generate decision metrics. The detection process (128) also may include utilizing the estimated C/I power ratio (126) in combining data samples (120) of the hop as received from two or more diversity receiver branches.

20 Claims, 2 Drawing Sheets

METHOD AND APPARATUS FOR IMPROVING DETECTION OF DATA BITS IN A SLOW FREQUENCY HOPPING COMMUNICATION SYSTEM

FIELD OF THE INVENTION

The present invention relates to communication systems which employ spread-spectrum signals and, more particularly, to a method and apparatus for improving a soft decision algorithm in a slow frequency hopping spread spectrum communication system.

BACKGROUND OF THE INVENTION

Communication systems take many forms. In general, the purpose of a communication system is to transmit information-bearing signals from a source, located at one point, to a user destination, located at another point some distance away. A communication system generally consists of three basic components: transmitter, channel, and receiver. The transmitter has the function of processing the message signal into a form suitable for transmission over the channel. This processing of the message signal is typically referred to as modulation. The function of the channel is to provide a physical connection between the transmitter output and the receiver input. The function of the receiver is to process the received signal so as to produce an estimate of the original message signal. This processing of the received signal is referred to as demodulation.

Two types of two-way communication channels exist, namely, point-to-point channels and point-to-multipoint channels. Examples of point-to-point channels include wirelines (e.g., local telephone transmission), microwave links, and optical fibers. In contrast, point-to-multipoint channels provide a capability where many receiving stations may be reached simultaneously from a single transmitter (e.g. cellular radio telephone communication systems). These point-to-multipoint systems are also termed Multiple Address Systems (MAS).

Analog and digital transmission methods are used to transmit a message signal over a communication channel. The use of digital methods offers several operational advantages over analog methods, including but not limited to: increased immunity to channel noise and interference, flexible operation of the system, common format for the transmission of different kinds of message signals, improved security of communication through the use of encryption, and increased capacity.

These advantages are attained at the cost of increased system complexity. However, through the use of very large-scale integration (VLSI) technology, a cost-effective way of building the hardware has been developed.

To transmit a message signal (either analog or digital) over a band-pass communication channel, the message signal must be manipulated into a form suitable for efficient transmission over the channel. Modification of the message signal is achieved by means of a process termed modulation. This process involves varying some parameter of a carrier wave in accordance with the message signal in such a way that the spectrum of the modulated wave matches the assigned channel bandwidth. Correspondingly, the receiver is required to recreate the original message signal from a degraded version of the transmitted signal after propagation through the channel. The re-creation is accomplished by using a process known as demodulation, which is the inverse of the modulation process used in the transmitter.

In addition to providing efficient transmission, there are other reasons for performing modulation. In particular, the use of modulation permits multiplexing, that is, the simultaneous transmission of signals from several message sources over a common channel. Also, modulation may be used to convert the message signal into a form less susceptible to noise and interference.

For multiplexed communication systems, the system typically consists of many remote units (i.e. subscriber units) which require active service over a communication channel for a short or discrete portion of the communication channel resource rather than continuous use of the resources on a communication channel. Therefore, communication systems have been designed to incorporate the characteristic of communicating with many remote units for brief intervals on the same communication channel. These systems are termed multiple access communication systems.

One type of communication system which can be a multiple access system is a spread spectrum system. In a spread spectrum system, a modulation technique is utilized in which a transmitted signal is spread over a wide frequency band within the communication channel. The frequency band is much wider than the minimum bandwidth required to transmit the information being sent. A voice signal, for example, can be sent with amplitude modulation (AM) in a bandwidth only twice that of the information itself. Other forms of modulation, such as low deviation frequency modulation (FM) or single sideband AM, also permit information to be transmitted in a bandwidth comparable to the bandwidth of the information itself. However, in a spread spectrum system, the modulation of a signal to be transmitted often includes taking a baseband signal (e.g., a voice channel) with a bandwidth of only a few kilohertz, and distributing the signal to be transmitted over a frequency band that may be many megahertz wide. This is accomplished by modulating the signal to be transmitted with the information to be sent and with a wideband encoding signal.

Three general types of spread spectrum communication techniques exist, including:

Direct Sequence

The modulation of a carrier by a digital code sequence whose bit rate is much higher than the information signal bandwidth. Such systems are referred to as "direct sequence" modulated systems.

Hopping

Carrier frequency shifting in discrete increments in a pattern dictated by a code sequence. These systems are called "frequency hoppers." The transmitter jumps from frequency to frequency within some predetermined set; the order of frequency usage is determined by a code sequence. Similarly "time hopping" and "time-frequency hopping" have times of transmission which are regulated by a code sequence.

Chirp

Pulse-FM or "chirp" modulation in which a carrier is swept over a wide band during a given pulse interval.

Information (i.e. the message signal) can be embedded in the spread spectrum signal by several methods. One method is to add the information to the spreading code before it is used for spreading modulation. This technique can be used in direct sequence and frequency hopping systems. It will be noted that the information being sent must be in a digital form prior to adding it to the spreading code, because the combination of the spreading code and the information typically a binary code involves module-2 addition. Alternatively, the information or message signal may be used to modulate a carrier before spreading it.

Thus, a spread spectrum system must have two properties: (1) the transmitted bandwidth should be much greater than the bandwidth or rate of the information being sent and (2) some function other than the information being sent is employed to determine the resulting modulated channel bandwidth.

Spread spectrum communication systems can be implemented as multiple access systems in a number of different ways. One type of multiple access spread spectrum system is a code division multiple access (CDMA) system. CDMA spread spectrum systems may use direct sequence (DS-CDMA) or frequency hopping (FH-CDMA) spectrum spreading techniques. FH-CDMA systems can further be divided into slow frequency hopping (SFH-CDMA) and fast frequency hopping (FFH-CDMA) systems. In SFH-CDMA systems several data symbols, representing a sequence of data bits which are to be transmitted, modulate the carrier wave within a single hop. Whereas, in FFH-CDMA systems the carrier wave hops several times per data symbol.

In a SFH-CDMA system, multiple communication channels are accommodated by the assignment of portions of a broad frequency and or time band to each particular channel. For example, communication between two communication units in a particular communication channel is accomplished by using a frequency synthesizer to generate a carrier wave in a particular portion of a predetermined broad frequency band for a brief period of time. The frequency synthesizer uses an input spreading code to determine the particular frequency from within the set of frequencies in the broad frequency band at which to generate the carrier wave. Spreading codes are input to the frequency synthesizer by a spreading code generator. The spreading code generator is periodically clocked or stepped through different transitions which causes different or shifted spreading codes to be output to the frequency synthesizer. Therefore, as the spreading code generator is periodically clocked, then so too is the carrier wave frequency hopped or reassigned to different portions of the frequency band. In addition to hopping, the carrier wave is modulated by data symbols representing a sequence of data bits which are to be transmitted. A common type of carrier wave modulation used in SFH-CDMA systems is M-ary frequency shift keying (MFSK), where $k = \log_2 M$ data symbols are used to determined which one of the M frequencies is to be transmitted.

Multiple communication channels are allocated by using a plurality of spreading codes to assign portions of the frequency band to different channels during the same time period. As a result, transmitted signals are in the same broad frequency band of the communication channel, but within unique portions of the broad frequency band assigned by the unique spreading codes. These unique spreading codes preferably are orthogonal to one another such that the cross-correlation between the spreading codes is approximately zero. Particular transmitted signals can be retrieved from the communication channel by despreading a signal representative of the sum of signals in the communication channel with a spreading code related to the particular transmitted signal which is to be retrieved from the communication channel. Further, when the spreading codes are orthogonal to one another, the received signal can be correlated with a particular spreading code such that only the desired signal related to the particular spreading code is enhanced while the other signals are not enhanced.

It will be appreciated by those skilled in the art that several different spreading codes exist which can be used to separate data signals from one another in a CDMA communication system. These spreading codes include but are not limited to pseudonoise (PN) codes and Walsh codes. A Walsh code corresponds to a single row or column of the Hadamard matrix. For example, in a 64 channel CDMA spread spectrum system, particular mutually orthogonal Walsh codes can be selected from the set of 64 Walsh codes within a 64 by 64 Hadamard matrix.

Further it will be appreciated by those skilled in the art that the data signals are typically channel coded to improve performance of the communication system by enabling transmitted signals to better withstand the effects of various channel impairments, such as noise, fading, and jamming. Typically, channel coding reduces the probability of bit error, and/or reduces the required signal to noise ratio usually expressed as bit energy per noise density ($E_b N_0$), to recover the signal at the cost of expending more bandwidth than would otherwise be necessary to transmit the data signal.

A typical spread spectrum transmission involves expanding the bandwidth of an information signal, transmitting the expanded signal and recovering the desired information signal by remapping the received spread spectrum into the original information signals bandwidth. This series of bandwidth trades used in spread spectrum signalling techniques allows a communication system to deliver a relatively error-free information signal in a noisy environment or communication channel. The quality of recovery of the transmitted information signal from the communication channel is measured by the error rate (i.e., the number of errors in the recovery of the transmitted signal over a particular time span or received bit span) for some $E_b/N_0$. As the error rate increases the quality of the signal received by the receiving party decreases. As a result, communication systems typically are designed to limit the error rate to an upper bound or maximum so that the degradation in the quality of the received signal is limited. In CDMA spread spectrum communication systems, the error rate is related to the noise interference level in the communication channel which is directly related to number of simultaneous but code divided users within the communication channel. Thus, in order to limit the maximum error rate, the number of simultaneous code divided users in the communication channel is limited. However, the error rate can be reduced by using channel coding schemes. The error rate can also be reduced by using diversity combining. Therefore, by using channel coding and/or diversity combining schemes the number of simultaneous users in a communication channel can be increased while still maintaining the same maximum error rate limit.

As discussed in *Digital Communications: Fundamentals and Applications* by Bernard Sklar, published by Prentice Hall, Englewood Cliffs, NJ in 1988, especially chapters 5 and 6 entitled "Channel Coding" found on pages 245-380, several of these channel coding and decoding schemes have been developed for use in communication systems. Among the decoding schemes discussed is using a maximum-likelihood (ML) decoding algorithm. In addition to the discussion found in Sklar's book above-mentioned, Gottfried Ungerboeck described in general MLSE decoding algorithms in "Adaptive Maximum-Likelihood Receiver for Carrier-Modulated Data-Transmission Systems", *IEEE Transactions on Communications*, vol. com-22, no. 5, May 1974, p.p. 624–636. However, a need exists for ML decoding schemes to be specifically optimized for use in frequency hopping spread spectrum communication systems. In optimizing the communication system with respect to the ML decoding algorithm, one starting point is analyzing the implementation of the ML decoding algorithm to the particular environment to which it is to be used. For the purposes of this discussion, the environment will include convolutional encoders and ML decoding algorithms similar to the Viterbi decoding algorithm. It will be appreciated by those skilled in the art that these principles can be applied to other encoding techniques such as block encoding and ML decoding algorithms other than Viterbi-like algorithms. Through the use of these optimized decoding schemes, the number of simultaneous users in a communication system can be increased over the number of simultaneous users in a communication system using non-optimized decoding algorithms while maintaining the same maximum error rate limit.

Several of diversity combining schemes have been developed for use in communication systems. Among the diversity combining schemes is the diversity reception technique described in U.S. Pat. No. 5,031,193 entitled "Method and Apparatus for Diversity Reception of Time-Dispersed Signals". This patent describes diversity combining stages which perform either bit by bit selection of or maximal ratio combining of signals received from several receiver branches. The diversity combined signal may optionally be subsequently used in estimating the received sequence. Another diversity reception scheme is described in U.S. Pat. No. 4,271,525 entitled " Adaptive Diversity Receiver For Digital Communications". This patent describes an adaptive diversity receiver using an adaptive transversal filter for each receiver branch, followed by a decision feedback equalizer. The tap gains of the transversal filters are updated via feedback from the output of the equalizer, and other points in the receiver. However, a need exists for diversity combining schemes to be specifically optimized for use in frequency hopping spread spectrum communication systems. In optimizing the communication system with respect to diversity combining, one starting point is analyzing the implementation of diversity combining to the particular environment to which it is to used. For the purposes of this discussion, the environment will include at least two receiver branches and a signal combining technique of either bit by bit selection or maximal ratio combining. It will be appreciated by those skilled in the art that these principles can be applied to other diversity combining techniques. Through the use of these optimized diversity combining schemes, the number of simultaneous users in a communication system can be increased over the number of simultaneous users in a communication system using non-optimized diversity combining techniques while maintaining the same maximum error rate limit.

SUMMARY OF THE INVENTION

A method and apparatus is provided for improving detection of data bits in data samples of a hop of a slow frequency hopping spread spectrum signal. In the detecting process, the carrier to interference (C/I) power ratio of the hop is estimated by using the data samples of the hop. Subsequently, a data bit is detected by using the estimated C/I power ratio. The detection process may include utilizing maximum likelihood decoding techniques to derive a data bit from decision metrics and the estimated C/I power ratio. The decision metrics correspond to a measurement of the distance of data samples from constellation points within a constellation space representing data samples previously used to generate decision metrics. The detection process also may include utilizing the estimated C/I power ratio in combining data samples of the hop as received from two or more diversity receiver branches.

DETAILED DESCRIPTION

Figure 1:
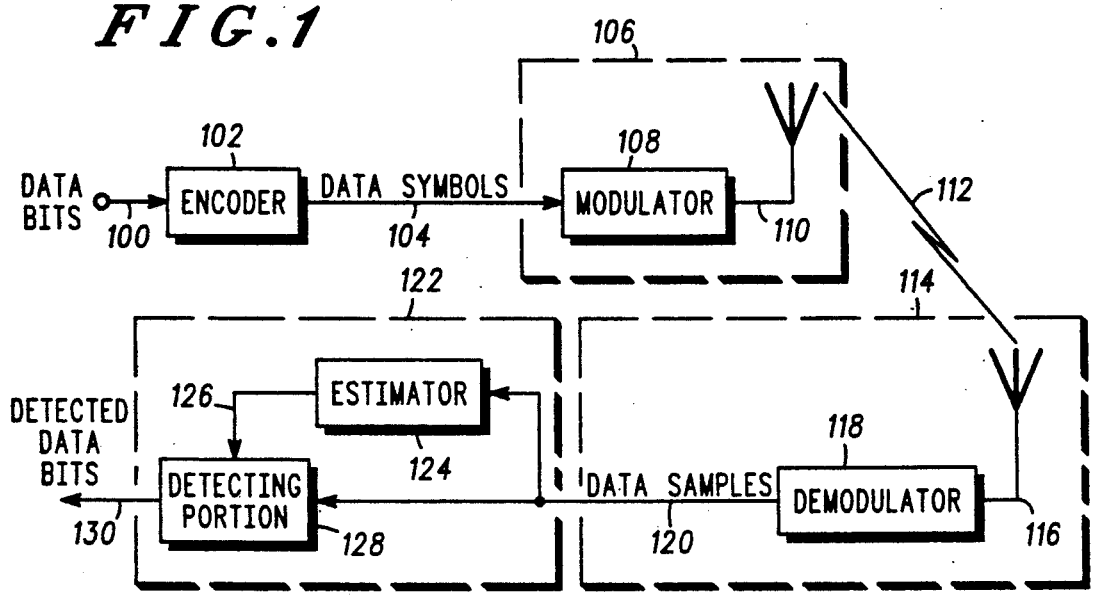
FIG. 1 is a block diagram showing a preferred embodiment slow frequency hopping communication system.

Referring now to FIG. 1, a preferred embodiment slow frequency hopping (SFH) communication system is shown. In optimizing the communication system, one starting point is analyzing the implementation of the ML decoding algorithm and diversity combining techniques to the particular environment to which it is to be used. For the purposes of this discussion, the environment will include convolutional encoding of data bits prior to transmission and slow frequency hopping signaling. It will be appreciated by those skilled in the art that these principles can be applied to other encoding techniques such as block encoding as well as other signalling techniques having properties similar to slow frequency hopping signalling such as time hopping signalling.

In order to design either a convolutional decoder to perform optimal ML decoding or a diversity combiner to perform optimal diversity combining, obtaining knowledge about the received carrier signal power to interference signal power ratio (i.e., C/I power ratio) is desirable. Measurement of the actual C/I power ratio in SFH communication systems can be difficult since the carrier signal hops at discrete time intervals over a broad frequency band. The C/I power ratio may change with each hop, since the interference in different portions of the broad frequency band may vary by the frequency. This variance of the interference at different frequencies may be due to signals other than the desired signal being transmitted at or near the same frequency as the desired frequency as well as from spurious noise bursts from electrical power generators and transmission lines, solar flares, atmospheric disturbances and the like. Therefore, since actual measurement is difficult, an approximation of the C/I power ratio in SFH communication systems is desirable.

In accordance with a preferred embodiment of the present invention one such approximation of the the C/I power ratio is proposed. In this preferred embodiment an assumption concerning the communication channel conditions has been made. This assumption is that the C/I power ratio remains constant over the duration of a single hop. Such an assumption is valid so long as the duration of the hop is short enough to be able to reasonably assume that the magnitude of the power interference sources in the communication channel would be constant over the hop. The preferred embodiment approximation or estimate of the C/I power ratio of a hop of a SFH spread spectrum signal is measured according to the following equation for $\Psi$:

$$\Psi = \frac{Ave^2\{Re\{z\}\}}{Ave\{|z|^2\} - Ave^2\{Re\{z\}\}} \quad \text{(eq. 1)}$$

In the equation (eq. 1), z represents the phase modulation cancelled forms of the data samples of a hop of the SFH signal. The data samples are samples of the complex envelope of the hop where the hop has been modulated by nth phase shift keying. Cancellation of nth phase shift keying modulation of the hop of the slow frequency hopping spread spectrum signal can be accomplished by raising the complex envelope of the hop to the nth power. As a result, z represents the phase modulation cancelled forms of the data samples which comprise samples of the complex envelope of the hop raised to the nth power for the nth phase shift keying modulated hop of the slow frequency hopping spread spectrum signal. For example, a complex envelope of a bi-phase shift key modulated (BPSK) hop of a SFH signal is raised to the second power (i.e., squared) in order to generate a phase modulation cancelled form of the hop. Similarly, a complex envelope of a quadrature phase shift key modulated (QPSK) hop of a SFH signal is raised to the fourth power in order to generate a phase modulation cancelled form of the hop.

In addition, in the equation (eq. 1), $Ave^2\{Re\{z\}\}$ is the square of the average of the real portion of z over the hop. More precisely, $z_k$ represents a single phase modulation cancelled data sample where the data sample is represented as a complex number having a real and an imaginary portion. In addition, N is the number of data samples of the complex envelope of the hop. Thus, $Ave^2\{Re\{z\}\}$ may be computed by squaring the result of the following equation:

$$\frac{1}{N} \sum_{k=1}^{N} Re\{z_k\} \quad \text{(eq. 2)}$$

in which the real portions of each data sample $z_i$ of the hop are summed together and subsequently divided by the number of data samples of the hop.

In addition, in the equation (eq. 1), $Ave\{|z|^2\}$ is the average of the square of the magnitude of the complex valued z (i.e. where z has a real and imaginary portion) over the hop. More precisely, as noted above, $z_k$ represents a single phase modulation cancelled data sample where the data sample is represented as a complex number having a real and an imaginary portion. In addition, N is the number of data samples of the complex envelope of the hop. Thus, $Ave\{|z|^2\}$ may be computed according to the following equation:

$$\frac{1}{N} \sum_{k=1}^{N} Re|z_k|^2 \quad \text{(eq. 3)}$$

in which the square of the absolute value of each data sample $z_k$ is summed together and subsequently divided by the number of data samples of the hop.

It will be appreciated by those skilled in the art that any monotonically related form of the estimate of the C/I power ratio ($\Psi$) may be used without departing from the scope of the present invention. For example, an estimate maybe formed using $\Psi$ in which $\Psi$ is raised to a power greater or less than one, $\Psi$ is multiplied or divided by a constant value or variable, and/or $\Psi$ is added to or subtracted from a constant value or variable. Further, it will be appreciated by those skilled in the art that this preferred embodiment C/I power ratio estimate ($\Psi$) has several advantages. These advantages include the ease of calculation of the estimate ($\Psi$) due to simple arithmetic operations being performed on digital values which represent data samples. Another advantage is the lack of need for measurements other than those already being done in the data bit detecting process. The sampling of the complex envelope of the hop is already being done in conjunction with the data bit detecting process. Further, measurement of the actual C/I power ratio would involve the additional steps of measuring the power of the carrier and interference signals over the hop. Yet another advantage is that this estimate ($\Psi$) does not require any prior knowledge concerning the data bits being transmitted within of the hop of the SFH signal.

This estimate of the C/I ratio ($\Psi$) of a hop is a monotonous function of the actual C/I power ratio. A derivation of a proof this statement follows. Each data sample ($x_k$) of the complex envelope of the received hop of the SFH signal is described by the following equation:

$$x_k = P + n_r + jn_i \quad \text{(eq. 4)}$$

where P is the average amplitude of the received data sample and $n_r, n_i$ are the real and imaginary components of the interference. Both $n_r, n_i$ are independent, zero mean normal variables, with equal variance $\sigma_n^2$ (i.e. they can be modeled as white, Gaussian noise). However, these following derivations can be easily extended by one skilled in the art to non-Gaussian noise. The actual C/I power ratio can be described as:

$$\frac{C}{I} = \frac{2 \cdot Ave^2\{Re\{x_k\}\}}{Var[Re\{x_k\}] + Var[Im\{x_k\}]} = \frac{P^2}{\sigma_n^2} \quad \text{(eq. 5)}$$

When a BPSK modulated SFH signal is used in the communication system, the derivation of the proof that the estimated C/I power ratio ($\Psi$) of (eq. 1) is a monotonous function of the actual C/I power ratio continues as follows.

$$z_k = x_k^2 = (P + n_r + jn_i)^2 = (P + n_r)^2 - n_i^2 + j2(P + n_r)n_i \quad \text{(eq. 6)}$$

where $z_k$ represents a single phase modulation cancelled data sample where the data sample ($x_k$) is represented as a complex number having a real and an imaginary portion and (eq. 4) was substituted into (eq. 6) for $x_k$.

In addition, in the equation (eq. 1), $Ave\{Re\{z\}\}$ is the average of the real portion of z over the hop. More precisely, $$\text{Ave}\{Re\{z\}\} = \overline{(P+n_r)^2} - \overline{n_i^2} \quad \text{(eq. 7)}$$
$$= \overline{P^2} + \overline{2Pn_r} + \overline{n_r^2} - \overline{n_i^2}$$
$$= P^2 + 0 + \sigma_n^2 - \sigma_n^2 = P^2$$

where the real portion of $z_k$ as defined in (eq. 6) was substituted in (eq. 7) and, in accordance with the definition of Gaussian noise model given above and the definition of the nth central moment of a Gaussian random variable, the average of $n_r$ and $n_i$ (i.e., $\overline{n_r}$ and $\overline{n_i}$) each go to zero over the hop and average of $n_r^2$ and $n_i^2$ (i.e., $\overline{n_r^2}$ and $\overline{n_i^2}$) each go to $\sigma_n^2$.

In addition, in the equation (eq. 1), $|z_k|^2$ is the square of the absolute value of $z_k$. More precisely, $$|z_k|^2 = [(P+n_r)^2 - n_i^2]^2 + [2(P+n_r)n_i]^2 \quad \text{(eq. 8)}$$
$$= (P+n_r)^4 - 2(P+n_r)^2 n_i^2 + n_i^4 + 4(P+n_r)^2 n_i^2$$
$$= (P+n_r)^4 + 2(P+n_r)^2 n_i^2 + n_i^4$$
$$= (P^4 + 4P^3 n_r + 6P^2 n_r^2 + 4Pn_r^3 + n_r^4) +$$
$$(2P^2 n_i^2 + 2Pn_r n_i^2 + 2n_r^2 + 2 n_r^2 n_i^2) + n_i^4$$

where the definition of $z_k$ from (eq. 6) was substituted in (eq. 8).

In addition, in the equation (eq. 1), $\text{Ave}\{|z|^2\}$ is the average of the square of the magnitude of the real and imaginary portions of $z$ over the hop. More precisely, $$\text{Ave}\{|z|^2\} = \overline{P^4} + \overline{4P^3 n_r} + \overline{6P^2 n_r^2} + \overline{4Pn_r^3} + \overline{n_r^4} + \quad \text{(eq. 9)}$$
$$\overline{2P^2 n_i^2} + \overline{2Pn_r n_i^2} + \overline{2n_r^2 n_i^2} + \overline{n_i^4}$$
$$= P^4 + 0 + 6P^2 \sigma_n^2 + 0 + 3\sigma_n^4 + 2P^2 \sigma_n^2 +$$
$$0 + 2\sigma_n^4 + 3\sigma_n^4$$
$$= P^4 + 8P^2 \sigma_n^2 + 8\sigma_n^4$$

where the square of the absolute value of $z_k$ as defined in (eq. 8) was substituted in (eq. 9). In addition, in accordance with the definition of Gaussian noise model given above and the definition of the nth central moment of a Gaussian random variable, the average of an odd power of $n_r$ and $n_i$ (i.e., $\overline{n_r}$ and $\overline{n_i}$) each go to zero over the hop and average of an even power n of $n_r$ and $n_i$ (i.e., $\overline{n_r}$ and $\overline{n_i}$) each go to a factor defined as:

$$\overline{n_r^n} = \overline{n_i^n} = 1 \cdot 3 \cdot 5 \cdot (n-1) \cdot \sigma_n^n \quad \text{(eq. 10)}$$

such that $\overline{n_r^2} = \overline{n_i^2} = \sigma_n^2$ and $\overline{n_r^4} = \overline{n_i^4} = 3\sigma_n^4$.

Thus, (eq. 5), (eq. 7) and (eq. 9) can be substituted into (eq. 1) as follows to derive an expression of the estimate of the power ratio ($\Psi$) in terms of actual C/I power ratio:

$$\Psi = \frac{\text{Ave}^2\{Re\{z\}\}}{\text{Ave}\{|z|^2\} - \text{Ave}^2\{Re\{z\}\}} \quad \text{(eq. 11)}$$
$$= \frac{P^4}{P^4 + 8P^2 \sigma_n^2 + 8\sigma_n^4 - P^4}$$
$$= \frac{P^4}{8P^2 \sigma_n^2 + 8\sigma_n^4}$$
$$= \frac{(C/I)^2}{8(C/I) + 8}$$

which is a monotonic function of C/I since the derivative of the estimate ($\Psi$) with respect to the actual C/I is greater than zero for all real and positive values of C/I. More precisely, $$\frac{\delta \Psi}{\delta(C/I)} = \frac{\delta}{\delta(C/I)} \frac{(C/I)^2}{8(C/I) + 8} = \frac{8(C/I)^2 + 16(C/I)}{[8(C/I) + 8]^2} > 0 \quad \text{(eq. 12)}$$

Thus, for a BPSK modulated SFH signal the estimated C/I power ratio ($\Psi$) of (eq. 1) is a monotonous function of the actual C/I power ratio.

When a QPSK modulated SFH signal is used in the communication system, the derivation of the proof that the estimated C/I power ratio ($\Psi$) of (eq. 1) is a monotonous function of the actual C/I power ratio continues as follows.

$$z_k = x_k^4 = (P + n_r + jn_i)^4 = (P + n_r)^4 - 6(P + n_r)^2 n_i^2$$
$$+ n_i^4 + j4(P + n_r)n_i[(P + n_r)^2 - n_i^2] \quad \text{(eq. 13)}$$

where $z_i$ represents a single phase modulation cancelled data sample where the data sample ($x_k$) is represented as a complex number having a real and an imaginary portion and (eq. 4) was substituted into (eq. 13) for $x_k$.

In addition, in the equation (eq. 1), $\text{Ave}\{Re\{z\}\}$ is the average of the real portion of $z$ over the hop. More precisely, $$\text{Ave}\{Re\{z\}\} = \overline{(P+n_r)^4} - \overline{6(P+n_r)^2 n_i^2} + \overline{n_i^4} \quad \text{(eq. 4)}$$
$$= (\overline{P^4} + \overline{4P^3 n_r} + \overline{6P^2 n_r^2} + \overline{4Pn_r^3} + \overline{n_r^4}) -$$
$$(\overline{6P^2 n_i^2} + \overline{12 n_r n_i^2} + \overline{6n_r^2 n_i^2}) + \overline{n_i^4}$$
$$= P^4 + 0 + 6P^2 \sigma_n^2 + 0 + 3\sigma_n^4 -$$
$$6P^2 \sigma_n^2 - 0 - 6\sigma_n^4 + 3\sigma_n^4$$
$$= P^4$$

where the real portion of $z_k$ as defined in (eq. 13) was substituted in (eq. 14) and, in accordance with the definition of Gaussian noise model given above and the definition of the nth central moment of a Gaussian random variable, the average of an odd power of $n_r$ and $n_i$ (i.e., $\overline{n_r}$ and $\overline{n_i}$) each go to zero over the hop and average of an even power n of $n_r$ and $n_i$ (i.e., $\overline{n_r}$ and $\overline{n_i}$) each go to a factor defined in (eq. 10) such that $\overline{n_r^2} = \overline{n_i^2} = \sigma_n^2$ and $\overline{n_r^4} = \overline{n_i^4} = 3\sigma_n^4$.

In addition, in the equation (eq. 1), $|z_k|^2$ is the square of the absolute value of $z_k$. More precisely, $$|z_k|^2 = [(P+n_r)^4 - 6(P+n_r)^2 n_i^2 + n_i^4]^2 + \quad \text{(eq. 15)}$$
$$[4(P+n_r)n_i[(P+n_r)^2 - n_i^2]]^2$$
$$= (P+n_r)^8 - 12(P+n_r)^6 n_i^2 + 38(P+n_r)^4 n_i^4 -$$
$$12(P+n_r)^2 n_i^6 + n_i^8 +$$
$$16(P+n_r)^2 n_i^2 [(P+n_r)^4 - 2(P+n_r)^2 n_i^2 + n_i^4]$$
$$= (P+n_r)^8 - 12(P+n_r)^6 n_i^2 + 38(P+n_r)^4 n_i^4 -$$
$$12(P+n_r)^2 n_i^6 + n_i^8 +$$
$$16(P+n_r)^6 n_i^2 - 32(P+n_r)^4 n_i^4 + 16(P+n_r)^2 n_i^6$$
$$= (P+n_r)^8 + 4(P+n_r)^6 n_i^2 + 6(P+n_r)^4 n_i^4 +$$
$$4(P+n_r)^2 n_i^6 + n_i^8$$
$$= (P^8 + 8P^7 n_r + 28P^6 n_r^2 + 56P^5 n_r^3 + 70P^4 n_r^4 +$$
$$56P^3 n_r^5 + 28P^2 n_r^6 + 8Pn_r^7 + n_r^8) +$$
$$4(P^6 + 6P^5 n_r + 15P^4 n_r^2 + 20P^3 n_r^3 + 15P^2 n_r^4 +$$
$$6Pn_r^5 + n_r^6) n_i^2$$
$$6(P^4 + 4P^3 n_r + 6P^2 n_r^2 + 4Pn_r^3 + n_r^4) n_i^4 +$$
$$4(P^2 + 2Pn_r + n_r^2) n_i^6 + n_i^8$$

where the definition of $z_k$ from (eq. 13) was substituted in (eq. 15).

In addition, in the equation (eq. 1), $\text{Ave}\{|z|^2\}$ is the average of the square of the magnitude of the real and imaginary portions of z over the hop. More precisely, $$\text{Ave}\{|z|^2\} = \text{Ave}\{((X|TO\ (P^8 + 8P^7n_r + 28P^6n_r^2 +$$
$$\underline{56P^5n_r^3 + 70P^4n_r^4)) +}$$
$$\underline{56P^3n_r^5 + 28P^2n_r^6 + 8Pn_r^7 + n_r^8) +}$$
$$\underline{[4\ (P^6 + 6P^5n_r + 15P^4n_r^2 + 20P^3n_r^3 + 15P^2n_r^4 +}$$
$$\underline{6Pn_r^5 + n_r^6)n_i^2] +}$$
$$\underline{(6(P^4 + 4P^3n_r + 6P^2n_r^2 + 4Pn_r^3 + n_r^4)n_i^4)}$$
$$(4(P^2 + 2Pn_r + n_r^2)n_i^6) + n_i^8$$

The above expression can be simplified by eliminating the terms which go to zero (i.e. those terms having $n_r$ or $n_i$ raised to an odd power) results in the following expression:

$$\text{(eq. 16)}$$
$$= \overline{(P^8 + 28P^6n_r^2 + 70P^4n_r^4 + 28P^2n_r^6 + n_r^8)} +$$
$$\overline{[4(P^6 + 15P^4n_r^2 + 15P^2n_r^4 + n_r^6)n_i^2]} +$$
$$\overline{(6(P^4 + 6P^2n_r^2 + n_r^4)n_i^4)} +$$
$$\overline{4(P^2 + n_r^2)n_i^6)} + n_i^8$$
$$= \overline{(P^8 + 28P^6n_r^2 + 70P^4n_r^4 + 28P^2n_r^6 + n_r^8)} +$$
$$\overline{(4P^6n_i^2 + 60P^4n_r^2n_i^2 + 60P^2n_r^4n_i^2 + 4n_r^6n_i^2)} +$$
$$\overline{(6P^4n_i^4 + 36P^2n_r^2n_i^4 + 6n_r^4n_i^4)} +$$
$$\overline{(4P^2n_i^6 + 4n_r^2n_i^6)} + n_i^8$$
$$= \overline{P^8} + \overline{28P^6n_r^2} + \overline{70P^4n_r^4} + \overline{28P^2n_r^6} + \overline{n_r^8} +$$
$$\overline{4P^6n_i^2} + \overline{60P^4n_r^2n_i^2} + \overline{60P^2n_r^4n_i^2} + \overline{4n_r^6n_i^2} +$$
$$\overline{6P^4n_i^4} + \overline{36P^2n_r^2n_i^4} + \overline{6n_r^4n_i^4} +$$
$$\overline{4P^2n_i^6} + \overline{4n_r^2n_i^6} + \overline{n_i^8}$$
$$= P^8 + 28P^6\sigma_n^2 + 210P^4\sigma_n^4 + 420P^2\sigma_n^6 + 105\sigma_n^8 +$$
$$4P^6\sigma_n^2 + 60P^4\sigma_n^4 + 180P^2\sigma_n^6 + 60\sigma_n^8 +$$
$$18P^4\sigma_n^4 + 108P^2\sigma_n^6 + 54\sigma_n^8 +$$
$$60P^2\sigma_n^6 + 60\sigma_n^8 + 105\sigma_n^8$$
$$= P^8 + 32P^6\sigma_n^2 + 288P^4\sigma_n^4 + 768P^2\sigma_n^6 + 384\sigma_n^8$$

where the square of the absolute value of $z_k$ as defined in (eq. 8) was substituted in (eq. 9). In addition,, in accordance with the definition of Gaussian noise model given above and the definition of the nth central moment of a Gaussian random variable, the average of an odd power of $n_r$ and $n_i$ (i.e., $\overline{n_r^n}$ and $\overline{n_i^n}$) each go to zero over the hop and average of an even power n of $n_r$ and $n_i$ (i.e., $\overline{n_r^n}$ and $\overline{n_i^n}$) each go to a factor defined in (eq. 10) such that $\overline{n_r^2} = \overline{n_i^2} = \sigma_n^2$, $\overline{n_r^4} = \overline{n_i^4} = 3\sigma_n^4$, $\overline{n_r^6} = \overline{n_i^6} = 15\sigma_n^6$, and $\overline{n_r^8} = \overline{n_i^8} = 105\sigma_n^8$.

Thus, (eq. 5), (eq. 14) and (eq. 16) can be substituted into (eq. 1) as follows to derive an expression of the estimate of the power ratio ($\Psi$) in terms of actual C/I power ratio:

$$\Psi = \frac{\text{Ave}^2\{Re\{z\}\}}{\text{Ave}\{|z|^2\} - \text{Ave}^2\{Re\{z\}\}} \quad \text{(eq. 17)}$$
$$= \Psi(P^8, P^8 + 32P^6\sigma_n^2 + 288P^4\sigma_n^4 + 768P^2\sigma_n^6 + 384\sigma_n^8 - P^8)$$
$$= \frac{P^8}{32P^6\sigma_n^2 + 288P^4\sigma_n^4 + 768P^2\sigma_n^6 + 384\sigma_n^8}$$
$$= \frac{(C/I)^4}{32(C/I)^3 + 288(C/I)^2 + 768(C/I) + 384}$$

which is a monotonic function of C/I since the derivative of the estimate ($\Psi$) with respect to the actual C/I is greater than zero for all real and positive values of C/I. More precisely, $$\frac{\delta\Psi}{\delta(C/I)} = \frac{\delta}{\delta(C/I)} \frac{(C/I)^4}{32(C/I)^3 + 288(C/I)^2 + 768(C/I) + 384} \quad \text{(eq. 18)}$$
$$= \frac{288(C/I)^5 + 1536(C/I)^4 + 1152(C/I)^3}{(32(C/I)^3 + 288(C/I)^2 + 768(C/I) + 384)^2} > 0$$

Thus, for a QPSK modulated SFH signal the estimated C/I power ratio ($\Psi$) of (eq. 1) is a monotonous function of the actual C/I power ratio.

It will be appreciated by those skilled in the art that the above derivations can be extended to any nth phase shift keying modulated SFH signal to prove that the estimated C/I power ratio ($\Psi$) of (eq. 1) is a monotonous function of the actual C/I power ratio for any nth phase shift keying modulated SFH signal.

Since this estimate of each hop's C/I power ratio ($\Psi$) of (eq. 1) is a monotonous function of the actual C/I power ratio, this estimate of each hop's C/I power ratio ($\Psi$) may preferably be used to determine a level of confidence that a particular hop was detected properly by a receiving station. The number of levels of confidence which may be determined can be varied depending on the particular use for the level of confidence. For example, two levels of confidence may be determined for use in a hard decision environment. The two levels of confidence include: (1) full confidence which corresponds to the estimated C/I power ratio being at or above a particular threshold and (2) no confidence which corresponds to the estimated C/I power ratio being below the particular threshold. In another example, several levels of confidence may be determined for use in a soft decision environment. These several levels of confidence correspond to increasing confidence as the estimated C/I power ratio increases in value.

A description of a preferred embodiment communication system, shown in FIG. 1, which incorporates the above mentioned optimizing principles for a data bit detection in a SFH signal follows. In the encoding portion 102 of the communication system, traffic channel data bits 100 are input to an encoder 102 at a particular bit rate. The input traffic channel data bits can include either voice converted to data by a vocoder, pure data, or a combination of the two types of data. Encoder 102 preferably encodes the input data bits 100 into data symbols 104 at a fixed encoding rate with an encoding algorithm which facilitates subsequent maximum likelihood decoding of the data symbols into data bits (e.g. convolutional or block coding algorithms).

The data symbols 104 may optionally then be interleaved by the encoding portion 102. Typically, interleaving increases the output distance between the consecutively input non-interleaved data symbols. This interleaving of data symbols causes burst of errors to be spread out in time and thus to be handled by the data bit detector as if they were random errors. This interleaving thereby allows random-error-correcting coding (e.g. convolutional coding) to be useful in a bursty noise communication channel (e.g. radio frequency communication channels). The interleaving preferably is limited to a predetermined size of the block of data symbols. The block size preferably is derived from the maximum number of data symbols, representing input data bits 100, which can be transmitted at a predetermined chip rate within a predetermined length transmission block. Subsequently, the interleaved data symbols 104 are output from the encoding portion 102. It will be appreciated by those skilled in the art that several different variations of interleaving could be implemented without departing from the scope of the present invention. For example, several different techniques can be used to interleave the data symbols (e.g., convolutional or block interleaving). In addition, the size of the interleaving block could be altered to accommodate different transmission lengths or rates. Also, the dimensions of the matrix could be altered to increase or decrease the interleaved distance between consecutively input groups of data symbols.

The interleaved data symbols 104 are then input to a transmitting portion 106 of the communication system. It will be appreciated by those skilled in the art that additional coding of the data symbols 104 may be done in the transmitting portion 106 to enable multiple access by several users to the same communication channel. Such encoding may include coding which ensures orthogonality of an individual users encoded traffic channel bits from other users encoded traffic channel bits. However, this additional coding typically depends upon the specific implementation of the SFH communication system. Further, this additional coding typically will not interfere with the implementation of the teachings of the present invention as described herein as long as the additional encoding is done after the initial encoding and the additional decoding is done prior to the preferred embodiment data bit detection process. The interleaved data symbols 104 are prepared for transmission over a communication channel as a SFH signal by a modulator 106. Subsequently, the modulated sequence is provided to an antenna 110 for transmission over the communication channel 112.

A receiving portion 114 of the communication system receives the transmitted SFH spread spectrum signal from over the communication channel 112 through antenna 116. Each hop of the received SFH signal preferably is sampled into data samples 120 by demodulator 118. Subsequently, the data samples 120 are output to the detector 122 of the communication system.

If the encoder 102 of the communication has interleaved the data symbols, then the detector 122 deinterleaves the data samples by using a technique which is substantially inverse to the interleaving technique used in the encoder 102. After, if necessary, such deinterleaving, the detector 122 of the communication system inputs the data samples 120 into a an estimator 124 which preferably generates an estimate of the C/I power ratio ($\Psi$) 126 for each hop in accordance with the algorithm described above as (eq. 1) and reproduced below:

$$\Psi = \frac{\text{Ave}^2\{Re\{z\}\}}{\text{Ave}\{|z|^2\} - \text{Ave}^2\{Re\{z\}\}} \quad \text{(eq. 1)}$$

The symbol z preferrably represents the phase modulation cancelled forms of the data samples of a hop of the SFH signal. The data samples preferably are samples of the complex envelope of the hop where the hop has been modulated by nth phase shift keying. Cancellation of nth phase shift keying modulation of the hop of the slow frequency hopping spread spectrum signal preferably is accomplished by raising the complex envelope of the hop to the nth power. As a result, z represents the phase modulation cancelled forms of the data samples which comprise samples of the complex envelope of the hop raised to the nth power for the nth phase shift keying modulated hop of the slow frequency hopping spread spectrum signal. It will be appreciated by those skilled in the art that any monotonically related form of the estimate of the C/I power ratio ($\Psi$) may be used without departing from the scope of the present invention.

The detector 122 of the communication system also inputs the data samples 120 into the detecting portion 128 which detects data bits 130 in the data samples 128 of each particular hop by using the estimated C/I power ratio 126 for that particular hop which was generated by the estimator 124.

Figure 2:
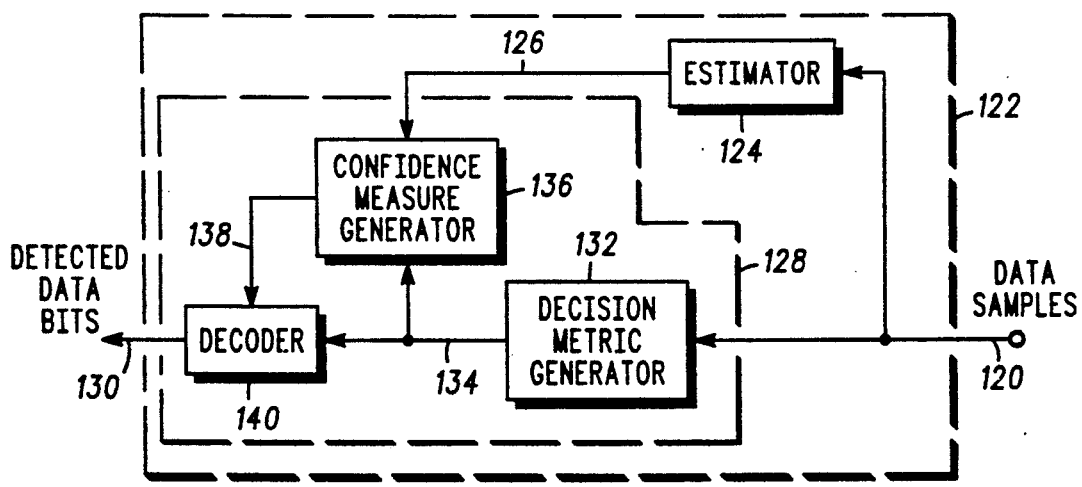
FIG. 2 is a block diagram showing a preferred embodiment data bit detection portion which utilize maximum likelihood decoding techniques.

The preferred embodiment described in reference to FIG. 1 may be further extended into a more specific use in the detection process of the C/I power ratio estimate 126 to the decoding process as shown in FIG. 2. In FIG. 2, the detector 122 input the data samples 120 associated with each hop into a decision metric generator 132 of the detecting portion 128. The decision metric generator 132 uses the input data samples 120 to generate decision metrics 134 associated with each hop which correspond to a distance of an input data sample from a constellation point within a constellation space representing previously input data samples 120. These decision metric 134 correspond to possible transitions within a maximum likelihood decoding trellis which decoder 140 will subsequently be determining.

The estimator 124 inputs the estimate of the C/I power ratio ($\Psi$) 126 associated with each hop into the detecting portion 128. The detecting portion 128 provides the C/I power ratio estimates ($\Psi$) 126 to a confidence measure generator 136. The confidence measure generator 136 also receives the decision metric 134 associated with each hop from the decision metric generator. The confidence measure generator 136 uses the C/I power ratio estimate ($\Psi$) 126 associated with a particular hop to determine a level of confidence 138 in the accuracy of the decision metrics 134 associated with the particular hop (i.e., accurately or actually relate to the transmitted encoded data bits 100). For example, if the C/I power ratio estimate ($\Psi$) 126 for the hop is below a predetermined threshold, then the probability that the data samples 120 of that hop actually represent the transmitted encoded data bits 100 is low. As a result the decision metrics 134 are probably not actually related to the transmitted encoded data bits 100, because the data samples 120 of the hop probably do not correspond to the transmitted encoded data bits 100.

The number of different levels of confidence 138 which may be determined for a particular hop can be varied depending on the particular use for the level of confidence 138. For example, two levels of confidence in the decision metrics 134 of each hop may be determined for use in a hard decision environment. The two levels of confidence include: (1) full confidence which corresponds to the estimated C/I power ratio being at or above a particular threshold and (2) no confidence which corresponds to the estimated C/I power ratio being below the particular threshold. In response to a full confidence measure 138, the associated decision metrics 134 for the hop would be used by the decoder 140. However, in response to a no confidence measure 138, the associated decision metrics 134 for the hop would not be used by the decoder 140. In another example, several levels of confidence in the decision metrics 134 of each hop may be determined for use in a soft decision environment. These several levels of confidence correspond to increasing confidence as the estimated C/I power ratio 138 increases in value. In response to the increasing level of confidence measure 138, the associated decision metrics 134 for the hop would be given greater weight by decoder 140. Such a weighting system of the decision metrics 134 by a decoder 140 is often termed using side information about the decision metrics 134.

The decoder 140 preferably generates estimated data bits 130 by utilizing maximum likelihood decoding technques to derive the estimated traffic channel data bits 130 from the decision metrics 134 of each hop and the associated confidence measures 138 which are input to the decoder 140. When the traffic channel data bits 100 have been convolutionally encoded, the maximum likelihood decoding techniques which are used may based upon the Viterbi decoding algorithm.

Figure 3:
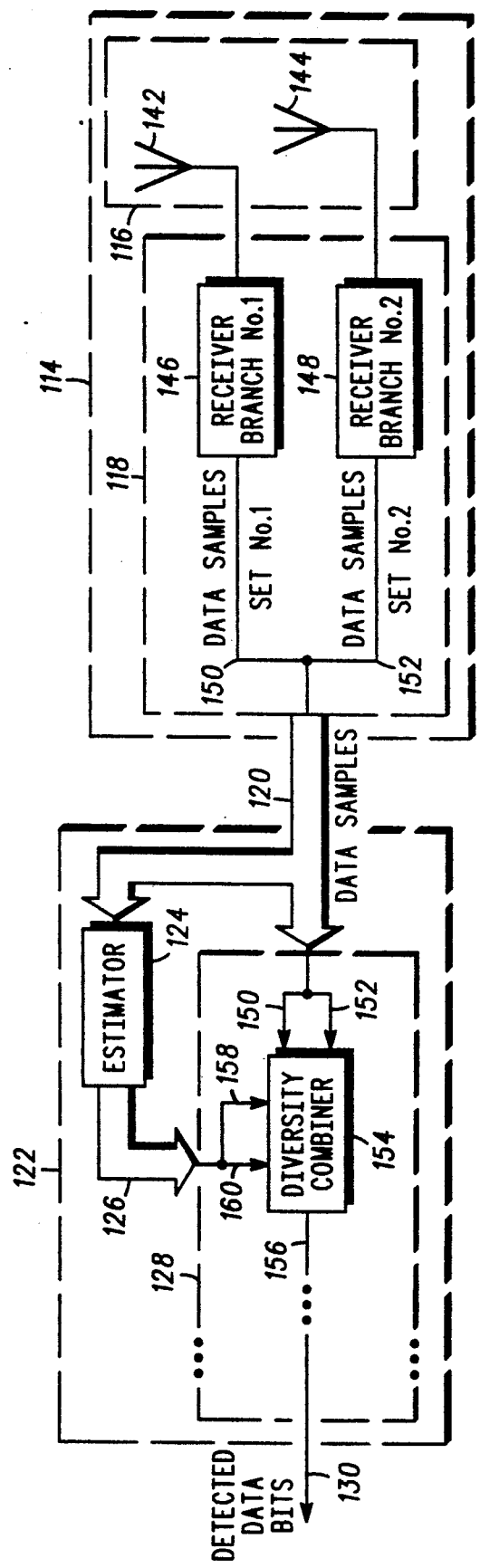
FIG. 3 is a block diagram showing preferred embodiment receiving and data bit detection portions which utilize diversity combining techniques.

The preferred embodiment described in reference to FIG. 1 may be further extended into a more specific use in the detection process of the C/I power ratio estimate 126 to the diversity combining process as shown in FIG. 3. In FIG. 3, the receiving portion 114 of the communication system receives the transmitted SFH spread spectrum signal from over the communication channel 112 through antenna structure 116. The antenna structure 116 preferably includes at least a first receiving antenna 142 and a second receiving antenna 144. The first receiving antenna 142 is preferably geographically displaced from the second receiving antenna 144 such that a diversity antenna structure is formed. Each hop of the SFH signal as received by the first and second antennae 142 and 144 is preferably input to the demodulator 118. Demodulator 118 includes a first and second receiver branch 146 and 148, respectively. The first receiver branch 146 is coupled to the first antenna 142 in order to demodulate and sample each hop of the SFH signal 122 received by the first antenna 142 into a first data sample set 150. Similarly, the second receiver branch 148 is coupled to the second antenna 144 in order to demodulate and sample each hop of the SFH signal 122 received by the second antenna 144 into a second data sample set 152. Subsequently, the sets of data samples 150 and 152 (collectively described as data samples 120) are output to the detector 122 of the communication system. The data samples 120 may preferably be coupled to detector 122 on a data bus having each of the data sample sets 150 and 152 thereon or by a set of individual data signal couplers for each data samples set 150 and 152.

The detector 122 of the communication system inputs the sets of data samples 120 into an estimator 124 which preferably generates a first and a second estimate of the C/I power ratio ($\Psi$) 158 and 160 (collectively described as C/I power ratio estimate 126) for each hop corresponding to the first and second set of data samples 150 and 152, respectively, in accordance with the algorithm described above as (eq. 1). These C/I power ratio estimates 126 are output to the detecting portion 128.

Similarly, the detector 122 of the communication system inputs the sets of data samples 120 (i.e. first and second sets 150 and 152, respectively) into the detecting portion 128. The detecting portion provides the first and second data sample sets 150 and 152 to a diversity combiner 154. The diversity combiner 154 combines the first and second sets of data samples 150 and 152, respectively, into a single combined set of data samples 156. The diversity combining is accomplished by using weighting coefficients for the first and second sets of input data samples 150 and 152 of each hop which are derived from the associated first and second C/I power ratio estimate 158 and 160 input.

The diversity combiner 154 uses the first and second C/I power ratio estimate ($\Psi$) 158 and 160, respectively, associated with a particular hop to determine a level of confidence in the accuracy of the reception of the first and second set of data samples 150 and 152, respectively associated with the particular hop by the receiving portion 114. For example, if the first C/I power ratio estimate ($\Psi$) 158 for the hop is below a predetermined threshold, then the probability that the first set of data samples 150 of that hop actually represent the transmitted encoded data bits 100 is nominal. The number of different levels of confidence in the accuracy of reception which may be determined for a particular hop can be varied depending on the particular use for the level of confidence. For example, two levels of confidence of each hop may be determined for use in a hard decision environment. The two levels of confidence include: (1) full confidence which corresponds to the estimated C/I power ratio being at or above a particular threshold and (2) no confidence which corresponds to the estimated C/I power ratio being below the particular threshold. In response to a full confidence measure, the associated set of data samples for the hop would be used by the diversity combiner 154 in generating the single combined set of data samples 156 for the hop. However, in response to a no confidence measure, the associated set of data samples for the hop would not be used by the diversity combiner 154 in generating the single combined set of data samples 156 for the hop. In another example, several levels of confidence in the accuracy of reception of each hop may be determined for use in a soft decision environment. These several levels of confidence correspond to increasing confidence as the estimated C/I power ratio 126 increases in value. In response to the increasing level of confidence, the associated set of data samples for the hop would be assigned greater weighting coefficients by the diversity combiner 154. It will be appreciated by those skilled in the art that these diversity combining techniques can be extended to combining a plurality of sets of data samples received on a corresponding plurality of receiver branches.

Subsequently, single combined set of data samples 156 preferably is used by the detecting portion 128 to detect data bits 130 in the data samples. Such detection may be accomplished by using a decoding technique similar to the one described above in reference to FIG. 2. However, other types of detection of data bits in the combined set of data samples 156 could be used without departing from the spirit and scope of preferred embodiment diversity combining invention as claimed.

Although the invention has been described and illustrated with a certain degree of particularly, it is understood that the present disclosure of embodiments has been made by way of example only and that numerous changes in the arrangement and combination of parts as well as steps may be resorted to by those skilled in the art without departing from the spirit and scope of the invention as claimed. For example, the modulator, antennas and demodulator portions of the preferred embodiment communication system as described were directed to CDMA spread spectrum signals transmitted over a radio communication channel. However, as will be understood by those skilled in the art, the communication channel could alternatively be an electronic data bus, wireline, optical fiber link, or any other type of communication channel.

What is claimed is:

1. An apparatus comprising a detector for detecting data bits in input data samples of a hop of a slow frequency hopping spread spectrum signal, the detector comprising:
   (a) estimator means for estimating the carrier to interference power ratio of the hop of the slow frequency hopping signal by using the input data samples of the hop; and (b) detecting means, operatively coupled to the estimator means, for detecting data bits in the input data samples of the hop of the slow frequency hopping signal by using the estimated carrier to interference power ratio.

2. The apparatus of claim 1 wherein the detector estimator means comprises means for computing the estimated carrier to interference power ratio with a metric at least comprising a monotonically related function ($\Psi$) defined as follows:

$$\Psi = \frac{Ave^2\{Re\{z\}\}}{Ave\{|z|^2\} - Ave^2\{Re\{z\}\}}$$

where, $z$ = phase cancelled forms of the input data samples wherein the input data samples represent the complex envelope of an nth phase shift keying modulated hop of the slow frequency hopping spread spectrum signal $Ave^2\{Re\{z\}\}$ = the square of the average of the real portion of z over the hop $Ave\{|z|^2\}$ = the average of the square of the magnitude of the complex valued z over the hop.

3. The apparatus of claim 2 wherein cancellation of nth phase shift keying modulation of the hop of the slow frequency hopping spread spectrum signal includes raising the complex envelope of the hop to the nth power whereby z represents the phase cancelled forms of the input data samples which comprise data samples of the complex envelope of the hop raised to the nth power for the nth phase shift keying modulated hop of the slow frequency hopping spread spectrum signal.

4. The apparatus of claim 1 wherein the detector detecting means comprises:

(a) means for generating decision metrics from the input data samples of the hop, each decision metric corresponding to a distance of an input data sample from a constellation point within a constellation space representing previously input data samples;

(b) means for generating a measure of confidence of the accuracy of the decision metrics based upon the estimated carrier to interference power ratio of the hop; and (c) decoding means for generating an estimated data bit by utilizing maximum likelihood decoding techniques to derive a data bit from the decision metrics and the accuracy measure of confidence of the decision metrics.

5. The apparatus of claim 1 wherein:

(a) the input data samples of the hop of the slow frequency hopping spread spectrum signal comprise a plurality of sets of input data samples of the hop, each set corresponding to input data samples of the hop as received from one of a plurality of diversity receiver branches;

(b) the estimator means comprises means for estimating a carrier to interference power ratio of the hop of the slow frequency hopping signal associated with each particular set of input data samples by using the particular set of input data samples of the hop; and (c) the detector detecting means comprises diversity combining means for combining the plurality of sets of input data samples into a set of input data samples in accordance with weighting coefficients for each particular set of input data samples derived from the estimated carrier to interference power ratio associated with the particular set of input data samples.

6. The apparatus of claim 1 further comprising:

(a) receiving means for receiving a slow frequency hopping spread spectrum signal from over a communication channel; and (b) sampling means, operatively coupled to the receiving means and the detector, for sampling a hop of the received slow frequency hopping spread spectrum signal into data samples and inputting the data samples of the hop of the received slow frequency hopping spred spectrum signal to the detector.

7. The apparatus of claim 1 further comprising:

(a) encoding means for encoding input data bits into data symbols with an encoding algorithm which facilitates subsequent detection of data bits in samples of the data symbols;

(b) a transmitting means, operatively coupled to the encoding means, for transmitting the data symbols over a communication channel as a slow frequency hopping spread spectrum signal;

(c) receiving means for receiving the slow frequency hopping spread spectrum signal from over the communication channel; and (d) sampling means, operatively coupled to the receiving means and the detector, for sampling a hop of the received slow frequency hopping spread spectrum signal into data samples and inputting the data samples of the hop of the received slow frequency hopping spread spectrum signal to the detector.

8. An apparatus comprising a detector, the detector comprising:

(a) sampling means for sampling a hop of an input slow frequency hopping spread spectrum signal into data samples;

(b) estimator means, operatively coupled to the sampling means, for estimating the carrier to interference power ratio of the hop of the slow frequency hopping signal by using the input data samples of the hop to compute the estimated carrier to interference power ratio with a metric at least comprising a monotonically related function ($\Psi$) defined as follows:

$$\Psi = \frac{Ave^2\{Re\{z\}\}}{Ave\{|z|^2\} - Ave^2\{Re\{z\}\}}$$

where, $z$ = phase cancelled forms of the input data samples wherein the input data samples represent the complex envelope of an nth phase shift keying modulated hop of the slow frequency hopping spread spectrum signal $Ave^2\{Re\{z\}\}$ = the square of the average of the real portion of z over the hop $Ave\{|z|^2\}$ = the average of the square of the magnitude of the complex valued z over the hop; and (c) detecting means, operatively coupled to the estimator means, for detecting data bits in the input data samples of the hop of the slow frequency hopping signal by using the estimated carrier to interference power ratio.

9. The apparatus of claim 8 wherein the detector detecting means comprises:
   (a) means for generating decision metrics from the input data samples of the hop, each decision metric corresponding to a distance of an input data sample from a constellation point within a constellation space representing previously input data samples;
   (b) means for generating a measure of confidence of the accuracy of the decision metrics based upon the estimated carrier to interference power ratio of the hop; and
   (c) decoding means for generating an estimated data bit by utilizing maximum likelihood decoding techniques to derive a data bit from the decision metrics and the accuracy measure of confidence of the decision metrics.

10. The apparatus of claim 8 wherein:
   (a) the sampling means comprises means for sampling the hop of the slow frequency hopping spread spectrum signal into a plurality of sets of data samples of the hop, each set corresponding to input data samples of the hop as received from one of a plurality of diversity receiver branches;
   (b) the estimator means comprises means for estimating a carrier to interference power ratio of the hop of the slow frequency hopping signal associated with each particular set of input data samples by using the particular set of input data samples of the hop; and
   (c) the detector detecting means comprises diversity combining means for combining the plurality of sets of input data samples into a set of input data samples in accordance with weighting coefficients for each particular set of input data samples derived from the estimated carrier to interference power ratio associated with the particular set of input data samples.

11. A method of communicating with slow frequency hopping spread spectrum signals including recovering data bits from data samples of a hop of a slow frequency hopping spread spectrum signal, the recovering steps comprising:
   (a) estimating the carrier to interference power ratio of the hop of the slow frequency hopping signal by using the data samples of the hop; and
   (b) detecting data bits in the data samples of the hop of the slow frequency hopping signal by using the estimated carrier to interference power ratio.

12. The method of claim 11 wherein the recovering step of estimating comprises computing the estimated carrier to interference power ratio with a metric at least comprising a monotonically related function ($\Psi$) defined as follows:

$$\Psi = \frac{Ave^2\{Re\{z\}\}}{Ave\{|z|^2\} - Ave^2\{Re\{z\}\}}$$

where,
   $z$ = phase cancelled forms of the input data samples wherein the input data samples represent the complex envelope of an nth phase shift keying modulated hop of the slow frequency hopping spread spectrum signal
   $Ave^2\{Re\{z\}\}$ = the square of the average of the real portion of $z$ over the hop
   $Ave\{|z|^2\}$ = the average of the square of the magnitude of the complex valued $z$ over the hop.

13. The method of claim 12 wherein cancellation of nth phase shift keying modulation of the hop of the slow frequency hopping spread spectrum signal includes raising the complex envelope of the hop to the nth power whereby $z$ represents the phase cancelled forms of the input data samples which comprise data samples of the complex envelope of the hop raised to the nth power for the nth phase shift keying modulated hop of the slow frequency hopping spread spectrum signal.

14. The method of claim 11 wherein the recovering step of detecting comprises the steps of:
   (a) generating decision metrics from the data samples of the hop, each decision metric corresponding to a distance of a data sample from a constellation point within a constellation space representing data samples previously used to generate decision metrics;
   (b) generating a measure of confidence of the accuracy of the decision metrics based upon the estimated carrier to interference power ratio of the hop; and
   (c) generating an estimated data bit by utilizing maximum likelihood decoding techniques to derive a data bit from the decision metrics and the accuracy measure of confidence of the decision metrics.

15. The method of claim 11 wherein:
   (a) the data samples of the hop of the slow frequency hopping spread spectrum signal comprise a plurality of sets of data samples of the hop, each set corresponding to data samples of the hop as received from one of a plurality of diversity receiver branches;
   (b) the recovering step of estimating comprises estimating a carrier to interference power ratio of the hop of the slow frequency hopping signal associated with each particular set of data samples by using the particular set of data samples of the hop; and
   (c) the recovering step of detecting comprises diversity combining the plurality of sets of data samples into a set of data samples in accordance with weighting coefficients for each particular set of data samples derived from the estimated carrier to interference power ratio associated with the particular set of data samples.

16. The method of claim 11 further comprising the steps of:
   (a) receiving a slow frequency hopping spread spectrum signal from over a communication channel; and
   (b) sampling a hop of the received slow frequency hopping spread spectrum signal into data samples.

17. The method of claim 11 further comprising the steps of:
   (a) encoding data bits into data symbols with an encoding algorithm which facilitates subsequent detection of data bits in samples of the data symbols;
   (b) transmitting the data symbols over a communication channel as a slow frequency hopping spread spectrum signal;
   (c) receiving the slow frequency hopping spread spectrum signal from over the communication channel; and
   (d) sampling a hop of the received slow frequency hopping spread spectrum signal into data samples.

18. A method of communicating with slow frequency hopping spread spectrum signals including recovering data bits from a slow frequency hopping spread spectrum signal, the recovering steps comprising:

(a) sampling a hop of the slow frequency hopping spread spectrum signal into data samples;
(b) estimating the carrier to interference power ratio of the hop of the slow frequency hopping signal by using the data samples of the hop to compute the estimated carrier to interference power ratio with a metric at least comprising a monotonically related function ($\Psi$) defined as follows:

$$\Psi = \frac{Ave^2\{Re\{z\}\}}{Ave\{|z|^2\} - Ave^2\{Re\{z\}\}}$$

where, $z$ = phase cancelled forms of the input data samples wherein the input data samples represent the complex envelope of an nth phase shift keying modulated hop of the slow frequency hopping spread spectrum signal $Ave^2\{Re\{z\}\}$ = the square of the average of the real portion of $z$ over the hop $Ave\{|z|^2\}$ = the average of the square of the magnitude of the complex valued $z$ over the hop; and (c) detecting data bits in the data samples of the hop of the slow frequency hopping signal by using the estimated carrier to interference power ratio.

19. The method of claim 18 wherein the recovering step of detecting comprises the steps of:
(a) generating decision metrics from the data samples of the hop, each decision metric corresponding to a distance of a data sample from a constellation point within a constellation space representing data samples previously used to generate decision metrics;
(b) generating a measure of confidence of the accuracy of the decision metrics based upon the estimated carrier to interference power ratio of the hop; and
(c) generating an estimated data bit by utilizing maximum likelihood decoding techniques to derive a data bit from the decision metrics and the accuracy measure of confidence of the decision metrics.

20. The method of claim 18 wherein:
(a) the data samples of the hop of the slow frequency hopping spread spectrum signal comprise a plurality of sets of data samples of the hop, each set corresponding to data samples of the hop as received from one of a plurality of diversity receiver branches;
(b) the recovering step of estimating comprises estimating a carrier to interference power ratio of the hop of the slow frequency hopping signal associated with each particular set of data samples by using the particular set of data samples of the hop; and
(c) the recovering step of detecting comprises diversity combining the plurality of sets of data samples into a set of data samples in accordance with weighting coefficients for each particular set of data samples derived from the estimated carrier to interference power ratio associated with the particular set of data samples.

* * * * *

REEXAMINATION CERTIFICATE (2500th)
United States Patent [19]
Meidan et al.

[11] B1 5,193,102
[45] Certificate Issued  Mar. 7, 1995

[54] METHOD AND APPARATUS FOR IMPROVING DETECTION OF DATA BITS IN A SLOW FREQUENCY HOPPING COMMUNICATION SYSTEM

[75] Inventors: Reuven Meidan, Ramat Hasharon; Noam Livneh, D.N. Misgav; Giora Silbershatz, Halfa; Mordechai Ritz, Givat-Elah, all of Israel

[73] Assignee: Motorola, Inc., Schaumburg, Ill.

Reexamination Request:
No. 90/003,330, Feb. 4, 1994

Reexamination Certificate for:
Patent No.: 5,193,102
Issued: Mar. 9, 1993
Appl. No.: 794,104
Filed: Nov. 18, 1991

[30] Foreign Application Priority Data
Nov. 10, 1991 [IL] Israel ................... 100029

[51] Int. Cl.$^6$ .................................... H04K 1/00
[52] U.S. Cl. ................................ 375/1; 380/34
[58] Field of Search ................. 375/162, 88, 89, 96; 380/34

[56] References Cited
U.S. PATENT DOCUMENTS

| | | | |
|---|---|---|---|
| 3,553,606 | 1/1971 | Port | 333/18 |
| 4,945,549 | 7/1990 | Simon et al. | 375/53 |
| 5,185,739 | 2/1993 | Spear | 370/95.3 |

OTHER PUBLICATIONS

Simon, Omura, Scholtz and Levitt, Spread Spectrum Communications, vol. 1, 1985, pp. 181, 187–188, 190–192, 202–203, 216–217.

Omura, Levitt, Coded Error Probability Evaluation for Antijam Communication Systems, IEEE on Communications vol. COM-30, No. 5 May 1982, pp. 896–903.

D'Avella, Renato, Moreno, Luigi and Sant'Agostino, Marcello, "An Adaptive MLSE Receiver for TDMA Digital Mobile Radio", *IEEE Journal on Selected Areas in Communications*, vol. 7, No. 1, Jan., 1989, pp. 122–129.

Primary Examiner—Tod R. Swann

[57] ABSTRACT

A method and apparatus is provided for improving detection of data bits in data samples (120) of a hop of a slow frequency hopping spread spectrum signal (112). In the detecting process, the carrier to interference (C/I) power ratio of the hop is estimated (124) by using the data samples (120) of the hop. Subsequently, a data bit (130) is detected by using the estimated C/I power ratio (126). The detection process (128) may include utilizing maximum likelihood decoding techniques to derive a data bit (130) from decision metrics and the estimated C/I power ratio (126). The decision metrics correspond to a measurement of the distance of data samples (120) from constellation points within a constellation space representing data samples (120) previously used to generate decision metrics. The detection process (128) also may include utilizing the estimated C/I power ratio (126) in combining data samples (120) of the hop as received from two or more diversity receiver branches.

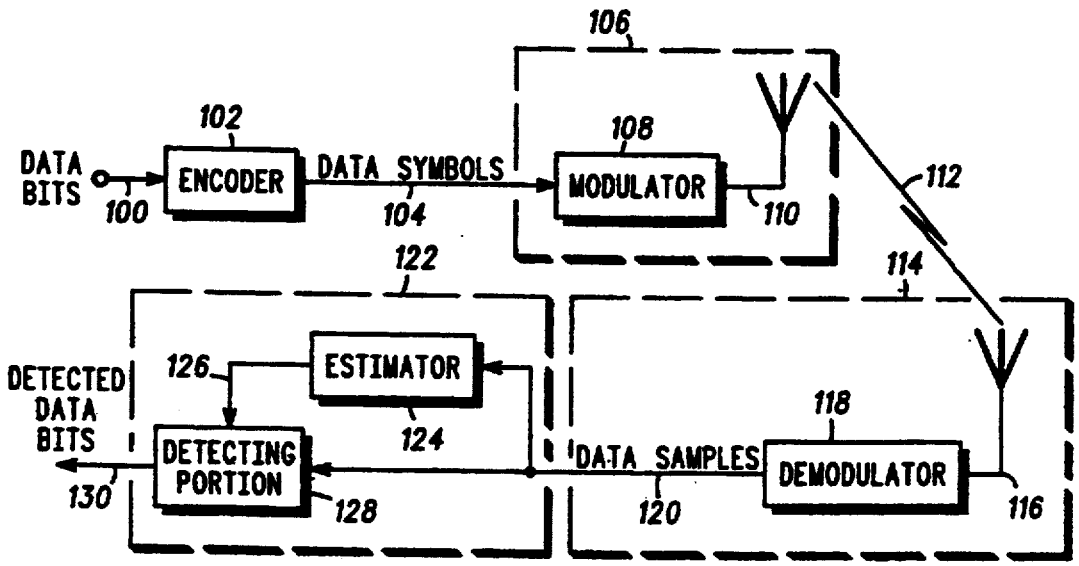

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-20 is confirmed.

* * * * *